United States Patent
Rufenacht et al.

(10) Patent No.: US 9,893,611 B2
(45) Date of Patent: Feb. 13, 2018

(54) METHOD FOR CONTROLLING COIL CURRENT OF A MAGNETO INDUCTIVE, FLOW MEASURING DEVICE

(71) Applicant: Endress + Hauser Flowtec AG, Reinach (CH)

(72) Inventors: Markus Rufenacht, Therwil (CH); Andre Spahlinger, Bad Bellingen (DE); Thomas Kung, Basel (CH)

( * ) Notice: Subject to any disclaimer, the term of this patent is extended or adjusted under 35 U.S.C. 154(b) by 492 days.

(21) Appl. No.: 14/410,680

(22) PCT Filed: Jun. 4, 2013

(86) PCT No.: PCT/EP2013/061419
§ 371 (c)(1),
(2) Date: Dec. 23, 2014

(87) PCT Pub. No.: WO2014/001026
PCT Pub. Date: Jan. 3, 2014

(65) Prior Publication Data
US 2015/0188416 A1  Jul. 2, 2015

(30) Foreign Application Priority Data
Jun. 28, 2012 (DE) .................. 10 2012 105 716

(51) Int. Cl.
*H02M 3/04* (2006.01)
*G01R 19/165* (2006.01)
*G01F 1/60* (2006.01)

(52) U.S. Cl.
CPC ............... *H02M 3/04* (2013.01); *G01F 1/60* (2013.01); *G01R 19/165* (2013.01)

(58) Field of Classification Search
CPC ........... H02M 3/04; G01F 1/60; G01R 19/165
(Continued)

(56) References Cited

U.S. PATENT DOCUMENTS

| 4,651,286 A | 3/1987 | Fukai |
| 4,766,770 A | 8/1988 | Mannherz |

(Continued)

FOREIGN PATENT DOCUMENTS

| DE | 3334152 A1 | 4/1985 |
| DE | 3616407 A1 | 11/1987 |

(Continued)

OTHER PUBLICATIONS

Machine translation of Holtfreter, German Patent Document DE 3616407 A1, Nov. 19, 1987.*

(Continued)

*Primary Examiner* — Thienvu Tran
*Assistant Examiner* — Kevin J Comber
(74) *Attorney, Agent, or Firm* — Bacon & Thomas, PLLC

(57) ABSTRACT

A method for controlling coil current of a magneto inductive, flow measuring device with a first value representing an overvoltage $U_O$ and a second value representing a holding voltage $U_H$, wherein the first value is greater than the second value, characterized by steps as follows: setting a first switching point $I_S$ for the electrical current level, up to which a coil should be supplied with the overvoltage $U_O$; applying an overvoltage $U_O$ until the electrical current level rises to the switching point IS set for the electrical current level; switching from the overvoltage $U_O$ to the holding voltage $U_H$, in order to hold the electrical current level at a constant electrical current end value $I_H$. Also intended is a magneto inductive, flow measuring device.

11 Claims, 1 Drawing Sheet

(58) Field of Classification Search
USPC .......................................................... 361/91.1
See application file for complete search history.

(56) References Cited

U.S. PATENT DOCUMENTS

| | | | |
|---|---|---|---|
| 4,784,000 | A | 11/1988 | Gaertner |
| 6,453,754 | B1 | 9/2002 | Florin |
| 6,477,070 | B2 | 11/2002 | Schweitzer |
| 6,763,729 | B1 | 7/2004 | Matzen |
| 2002/0000798 | A1 | 1/2002 | Schweitzer |
| 2006/0081067 | A1* | 4/2006 | Budmiger ........... G01F 25/0007 73/861.08 |

FOREIGN PATENT DOCUMENTS

| | | |
|---|---|---|
| DE | 19917268 A1 | 11/2000 |
| DE | 102004046238 A1 | 3/2006 |
| DE | 102006016564 A1 | 10/2007 |
| DE | 102008034566 A1 | 2/2010 |
| WO | 2006032612 A1 | 3/2006 |

OTHER PUBLICATIONS

English Translation of the International Preliminary Report on Patentability, WIPO, Geneva, dated Jan. 8, 2015.
International Search Report, EPO, The Netherlands, dated Sep. 30, 2013.
German Search Report, German PTO, Munich, dated Feb. 25, 2013.

* cited by examiner

METHOD FOR CONTROLLING COIL CURRENT OF A MAGNETO INDUCTIVE, FLOW MEASURING DEVICE

TECHNICAL FIELD

The invention relates to a method for controlling the coil current of a magneto inductive, flow measuring device and to a magneto inductive, flow measuring device.

BACKGROUND DISCUSSION

A coil current flows in a coil arrangement, which has an inductance and which is part of a magnet system containing coil cores and/or pole shoes. The coil current is clocked such that the coil current is positive in a first half of a period and has a constant first electrical current end value and negative in the second half of the period with a constant second electrical current end value, which is of equal magnitude to that of the first electrical current end value.

The coil cores and/or pole shoes of the magnet system are, most often, formed of a soft magnetic material. There are, however, also magnet systems with ferromagnetic coil cores.

In the case of both types of magnet systems, there are induced in the magnet system, due to the rise and fall of the coil current, eddy currents, which prevent the rise of the magnetic field from following exactly the rise of the coil current, such as would be the case, if the coil cores and/or pole shoes were absent. Rather, the rise of the magnetic field is delayed and flattened, compared with that of the coil current. In such a situation, an exact control of the coil current to a constant end magnitude is required.

European Patent EP 0 969 268 A1 discloses a method for controlling coil current, wherein, first of all, an overvoltage is provided for a predetermined time interval and after this time interval a feedback control occurs. This method has, as a rule, proved itself in practice. If, however, due to fluctuations or disturbances, there is a shifting of the starting point, then, for example, a higher maximum electrical current level would be produced in the constant time interval and this could, in given cases, lead to overloading.

Moreover, also known are methods, which have a diagnostic function to check for a maximum electrical current level. In these methods, however, the electrical current level serves not as a control variable, but, instead, is only taken into consideration as a value for checking the control unit.

SUMMARY OF THE INVENTION

It is, consequently, an object of the present invention, based on EP 0 969 268 A1 as a nearest state of the art, to provide an alternative method for controlling the coil current.

According to the invention, a method is provided for controlling the coil current of a magneto inductive, flow measuring device with a first value representing an overvoltage $U_O$ and a second value representing a holding voltage $U_H$, wherein the first value is greater than the second value, characterized by steps as follows:

A setting a first switching point $I_S$ for the electrical current level, up to which a coil should be supplied with the overvoltage $U_O$;

B applying an overvoltage $U_O$ until the electrical current level rises to the switching point $I_S$ set for the electrical current level;

C switching from the overvoltage $U_O$ to the holding voltage $U_H$, in order to hold the electrical current level at a constant electrical current end value $I_H$.

The method of the invention reliably avoids the disadvantages described for the state of the art.

Advantageous embodiments of the invention are subject matter of the dependent claims.

After the switching of the overvoltage to the holding voltage, which is preferably controlled by a comparator, the electrical current level still rises slightly due to the self-inductance of the coil. After the small rise in the electrical current level, a likewise small decline of the electrical current level can occur, which can cause the comparator to switch back to the overvoltage. In order to prevent this switching back, the switching is monitored. The monitoring and the preventing of the switch back of the comparator resulting from the special method for controlling the coil current can advantageously be implemented by a flip-flop circuit.

Especially preferably, the method for controlling the coil current in a magneto inductive, flow measuring device is applied in the case of a two-conductor field device.

Traditionally, such two-conductor field devices are predominantly so designed that an instantaneous electrical current level of the supply current instantaneously flowing in a single pair line formed as an electrical current loop at a value between 4 mA and 20 mA simultaneously also represents the measured value produced at the moment by the field device, respectively the actuating value sent at the moment to the field device. As a result of this, a special problem of such two-conductor field devices is that the electrical power at least nominally convertible or to be converted by the field device-electronics during operation (in the following referred to as "available power" for short) can fluctuate in a practically unpredictable manner over a broad range. Taking this into consideration, modern two-conductor field devices (2L field devices), especially modern two-conductor measuring devices (2L measuring devices) with a (4 mA to 20 mA) electrical current loop, are, consequently, usually so designed that their device functionality implemented by means of a microcomputer provided in the evaluating and operating circuit is changeable, and, thus, the operating and evaluating circuit converting most often in any event only little power can be adapted to the instantaneously available power.

BRIEF DESCRIPTION OF THE DRAWINGS

In the following, a preferred embodiment of the invention will now be explained in greater detail based on the appended drawing, the figures of which show as follows.

DETAILED DISCUSSION IN CONJUNCTION WITH THE DRAWINGS

The method of the invention will now be described in greater detail based on the graph of FIG. 2.

Figure 2:
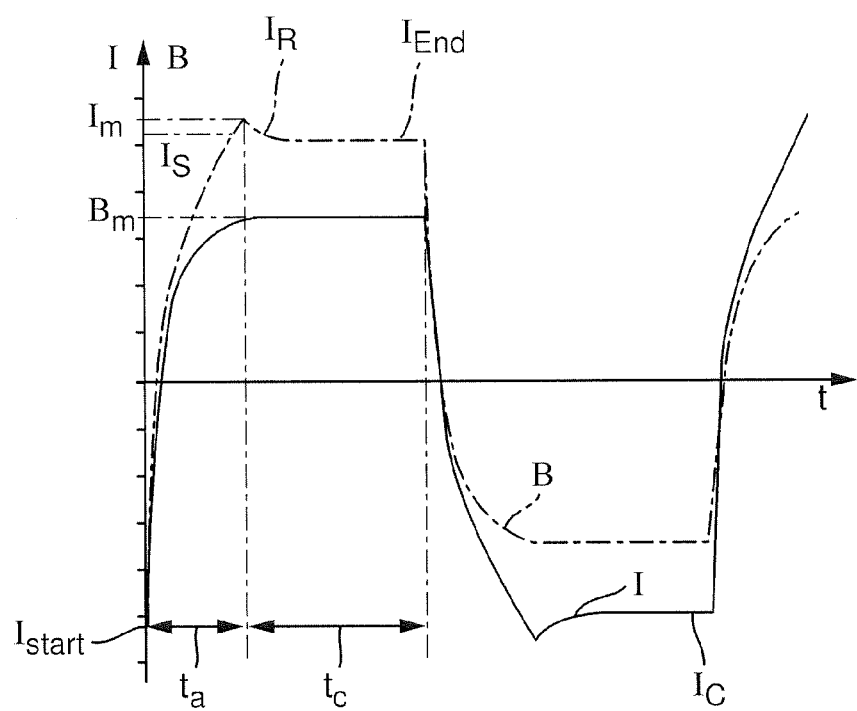
FIG. 2 is a graph of the electrical current in the method of the invention.

FIG. 2 shows firstly electrical current for coil control. A coil current flows in a coil arrangement having an inductance L. The coil arrangement is part of a magnet system. The coil current is positive in the first half of a period and then negative in a second half of the period. In the method disclosed in EP 0 969 268, an overvoltage is applied for a time ta, in order to elevate an electrical current level from the so-called negative field to the level Im. Then, for a time tc, a holding voltage is supplied. In such case, the electrical current level rises during the time ta to the value Im. The coil current I rises steeply during the time $t_a$.

It has, thus, long been the practice to associate the setting of the electrical current level with a starting point in the negative field. The electrical current is elevated with an overvoltage and the time of application of the overvoltage controlled to achieve the desired electrical current level.

In contrast therewith, there occurs in the case of the method of the invention a supplying of the coil arrangement with an overvoltage $U_O$ and then with a holding voltage $U_H$, wherein the overvoltage is greater than the holding voltage. In such case, there occurs, first of all, a setting of a switching point $I_S$ for the electrical current level, up to which a coil should be supplied with the overvoltage $U_O$.

Then, there occurs an applying of an overvoltage $U_O$, until the electrical current level rises to the instantaneously set, desired value $I_S$ of the electrical current level.

Finally, there occurs a switching of the overvoltage $U_O$ to the holding voltage $U_H$, in order to hold the electrical current level at a constant electrical current end value $I_H$.

Figure 1:
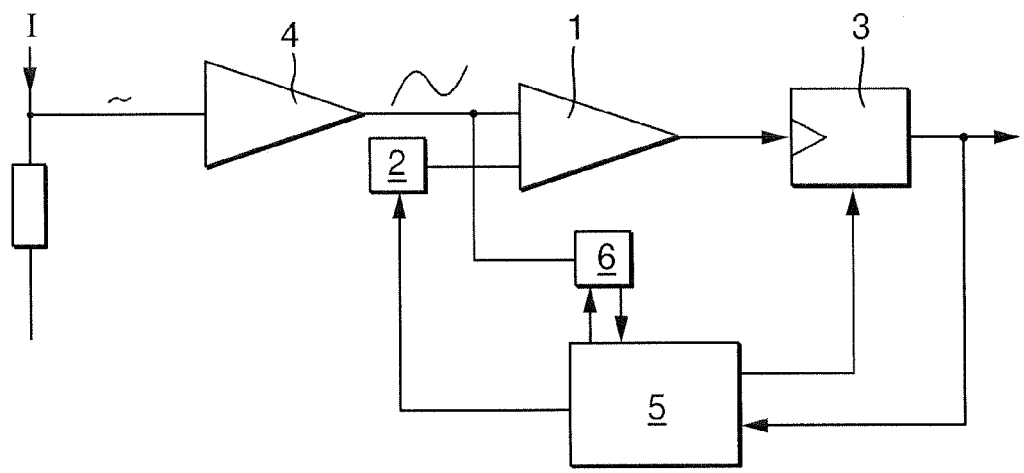
FIG. 1 is a schematic representation of a circuit working according to the method of the invention.

FIG. 1 shows a circuit for performing the method. In the circuit, an amplifier 4 is connected to a first input of a comparator 1. The output of the comparator 1 is connected with a flip-flop circuit 3. Furthermore, a D/A converter 2 is connected with a second input of the comparator. D/A converter is connected at its input with an evaluation unit 5 and converts digital signals of the evaluation unit 5 into analog signals, which are led to the second input of the comparator 1. From the connection between the amplifier 4 and the comparator 1 a path leads to an A/D converter 6, which is connected with the evaluation unit 5. The preset of the flip-flop circuit 3 is connected with the evaluation unit, while the output of the flip-flop circuit 3 is connected to a voltage source (not shown). Branching from the output of the flip-flop circuit is a connection to an input of the evaluation unit 5.

The operation of the circuit will now be explained in greater detail based on electrical current equivalent voltages. The circuit is supplied with an input signal in the form of a voltage of small amplitude, which is firstly amplified in the amplifier 4. The amplified input signal is then forwarded to the comparator 1. A comparator is, as is known, an operational amplifier without negative feedback and enables the comparison of very small voltage differences. In practice, compared on the input side of the comparator 1 are the amplified input signal E, on the one hand, and, on the other hand, a desired value S for an electrical current level equivalent voltage. This desired value S corresponds to a switching point $I_S$ for an electrical current level, up to which a coil should be supplied with the overvoltage $U_O$. The desired value S is predetermined by the evaluation unit 5 and goes through the D/A converter 2 two the second input of the comparator 1. The desired value S can be adjusted.

As long as the signal fed to the first input lies below the desired value, thus E<S, the coil is supplied the overvoltage $U_O$ by the above-mentioned voltage source (connected with the output of the flip-flop circuit 3). Upon reaching the desired value, the output signal of the comparator changes in such a manner that the new output signal effects a switching from the overvoltage $U_O$ to a holding voltage $U_H$, for example, as a result of a sign change or a switching from 1 to 0.

Upon the switching, due to the self-inductance of the coil arrangement, an additional slight rise of the electrical current level can occur, accompanied by the electrical current level equivalent voltage. The electrical current level then falls to a constant electrical current end value $I_{End}$ at the holding voltage $U_H$. This decline can lead for a short time to the fact that the input signal E is once more less than the desired value S, which would lead to a switching of the comparator 1 back to overvoltage operation. In order to prevent this switching back to overvoltage operation, the comparator 1 is connected on its output side with a flip-flop circuit 3.

The comparator, thus, with reference to the electrical current level wave form of FIG. 2, starting at some starting point $I_{start}$, tracks the electrical current increase up to a set switching point Is. The comparator 1 performs this tracking with the aid of the D/A converter 2. The comparator 1 also initiates the switching to a holding voltage $U_H$. This is shown in FIG. 1. In an especially preferred embodiment of FIG. 1, the circuit includes, supplementally, the flip-flop 3, whose function has been explained above. After the switching to the holding voltage $U_H$ and a subsequent time dependent on the self-induction of the coil, a constant electrical current end value $I_{End}$ results. This electrical current end value $I_{End}$ in the present example of an embodiment is preset, respectively fixed, as a desired end value.

In the preferred embodiment of FIG. 1, the circuit additionally includes an A/D converter 6, which converts an electrical current equivalent voltage of a current electrical current level I at the first input of the comparator 1 into a digital signal and sends such to the evaluation unit 5. This input signal E is converted by the A/D converter 6 into a digital signal, which is proportional to the currently applied electrical current level. At a discrete point in time after the switching to the holding voltage $U_H$, for example, after 5 ms, the evaluation unit queries the output value of the A/D converter corresponding to the current electrical current level $I_R$ at the measurement point in time. If the queried value $I_R$ is less than the electrical current end value $I_H$ of the holding voltage $U_H$, then the switching point $I_S$ for the electrical current level, up to which a coil should be supplied with the overvoltage $U_O$, respectively the thereto electrical current equivalent voltage S on the input of the comparator, is set by the evaluation unit 5 and the D/A transducer 2 to a higher value.

The preceding explanation of a possible adjusting of the switching point Is for the electrical current level, up to which a coil should be supplied with the overvoltage $U_O$, is to be understood only as preferred embodiment.

Thus, in an additional embodiment, selected as a desired end value can be, instead of the electrical current end value $I_{End}$, for example, an electrical current level, which is greater than the electrical current end value $I_{End}$.

According to the invention, the electrical current level is a control variable in the present method. In such case, for example, at start-up, a first switching point $I_S$ of 22 mA is predetermined. Based on this first starting value, there occurs a first increasing of the electrical current level to the said switching point.

Following the increasing and switching, for example, after a time of 5 ms, there occurs a comparison of the current electrical current level $I_R$ with the predetermined desired end value. If, for example, the current electrical current level $I_R$ lies below the desired end value, then the controllable switching point $I_S$ is increased. If, for example, the current electrical current level $I_R$ lies above the desired end value, then the adjustable switching point $I_S$ is lowered. Thus, there occurs before each increasing a re-setting of the switching point $I_S$, with whose electrical current equivalent voltage S the comparator 1 performs the already described comparison with the input signal E.

Thus, this circuit permits execution of a method for coil current control of a magneto inductive, flow measuring device.

As a result—other than in the past—the switching between the overvoltage and the holding voltage is directly controllable based on a settable switching point $I_S$ for the electrical current level, while the time interval up to the setting of this switching point $I_S$ is variable. The control of the switching interval by the specification of an electrical current level has the advantage that, in this way, also power supplies with less constant voltages can be applied for flow measuring devices. Since voltage fluctuations have less influence, then, also smaller power supplies can be used, whereby a miniaturization and a saving of material costs is achieved. A supplying of the coils with clocked electrical current with pulse pauses is, consequently, possible, wherein, in the case of two-conductor field devices, as a whole, a better management of the small available electrical current level is possible. Moreover, an independence from the starting point $I_{start}$ (at $t_0$) is achieved.

An additional advantage of the present invention lies in the faster approach time. As was customary, the time $t_a$ had to be slowly increased, in order to prevent overloading. Thus, it was, for example, possible that within the time interval $t_a$ due to external influences the electrical current level could rise far above the intended value. This can be prevented in the present method by specification of the switching point for $I_S$.

On the whole, the new method is more robust than the previous method as regards environmental influences. The new method is independent of the starting point and the stability of the applied voltage.

The invention claimed is:

1. A method for controlling coil current of a magneto inductive, flow measuring device with a first value representing an overvoltage UO and a second value representing a holding voltage UH, wherein the first value is greater than the second value, comprising the steps of:
    setting a first switching point IS for the electrical current level, up to which a coil should be supplied with the overvoltage UO;
    applying an overvoltage UQ until the electrical current level rises to the switching point Is set for the electrical current level;
    switching from the overvoltage UQ to the holding voltage UH, in order to hold the electrical current level at a constant electrical current end value IH; and
    after said switching, an evaluation of a current electrical current level I occurs, along with an adjusting of the switching point L of the electrical current level is performed by a comparator.

2. The method as claimed in claim 1, wherein:
    a comparison of the current electrical current level $I_R$ with said switching point $I_S$ of the electrical current level is performed by a comparator.

3. The method as claimed in claim 2, wherein:
    said switching from the overvoltage $U_O$ to the holding voltage $U_H$ is initiated by said comparator; and
    said switching of said comparator is evaluated, in order to prevent a switching back to the overvoltage $U_O$.

4. The method as claimed in claim 3, wherein:
    said switching back of the holding voltage $U_H$ to the overvoltage $U_O$ is prevented by a flip-flop circuit.

5. The method as claimed in claim 1, wherein:
    a comparison of an input signal E of an electrical current equivalent voltage with a desired value for an electrical current level equivalent voltage S of the switching point $I_S$ occurs time independently before said switching.

6. The method as claimed in claim 1, wherein:
    said setting of the first switching point $I_S$ occurs according to the following:
    i) ascertaining a value, which represents a current electrical current level $I_R$, after said switching;
    ii) comparing the current electrical current level $I_R$ with a preset desired end value for the electrical current end value $I_{End}$, which occurs in the case of continued holding voltage $U_H$; and
    iii) changing the switching point $I_S$, in the case of a deviation of the current electrical current level $I_R$ from the electrical current end value $I_{End}$.

7. The method as claimed in claim 1, wherein:
    the first value representing the overvoltage $U_O$ is greater than twice as large as the second value representing the holding voltage $U_H$.

8. The use of the method as claimed in claim 1, for controlling the coil current of a magneto inductive, flow measuring device in two conductor technology.

9. A magneto inductive, flow measuring device, comprising:
    a coil arrangement; and
    a circuit for controlling a coil current, according to a method which comprises a method for controlling coil current of a magneto inductive, flow measuring device with a first value representing an overvoltage $U_O$ and a second value representing a holding voltage $U_H$, wherein the first value is greater than the second value, comprising the steps of: setting a first switching point IS for the electrical current level, up to which a coil should be supplied with the overvoltage $U_O$; applying an overvoltage $U_O$ until the electrical current level rises to the switching point $I_S$ set for the electrical current level; and switching from the overvoltage $U_O$ to the holding voltage $U_H$, in order to hold the electrical current level at a constant electrical current end value $I_H$, which circuit is designed to supply the coil arrangement with an overvoltage $U_O$ and a holding voltage $U_H$, wherein:
    said circuit has a comparator for comparing the current electrical current level $I_R$ with a switching point $I_s$ of the electrical current level;
    said circuit is adapted to switch from the overvoltage $U_O$ to the holding voltage $U_H$ upon reaching the switching point $I_S$ of the electrical current level; and
    after switching, an evaluation of a current electrical current level I occurs, along with an adjusting of the switching point $I_S$ of the electrical current level is performed by a comparator.

10. The magneto inductive flow measuring device as claimed in claim 9, wherein:
    said magneto inductive flow measuring device is embodied preferably as a two conductor field device.

11. The magneto inductive flow measuring device as claimed in claim 10, wherein:
    said circuit additionally contains a flip-flop circuit for preventing switching back from the holding voltage $U_H$ to the overvoltage $U_O$.

* * * * *